(12) United States Patent
Rae et al.

(10) Patent No.: US 11,404,343 B2
(45) Date of Patent: Aug. 2, 2022

(54) PACKAGE COMPRISING A SUBSTRATE CONFIGURED AS A HEAT SPREADER

(71) Applicant: QUALCOMM Incorporated, San Diego, CA (US)

(72) Inventors: David Fraser Rae, San Diego, CA (US); John Holmes, San Diego, CA (US); Marcus Hsu, San Diego, CA (US); Kuiwon Kang, San Diego, CA (US); Avantika Sodhi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/789,272

(22) Filed: Feb. 12, 2020

(65) Prior Publication Data
US 2021/0249325 A1 Aug. 12, 2021

(51) Int. Cl.
| | |
|---|---|
| *H01L 23/367* | (2006.01) |
| *H01L 21/56* | (2006.01) |
| *H01L 23/31* | (2006.01) |
| *H01L 23/42* | (2006.01) |
| *H01L 23/498* | (2006.01) |

(52) U.S. Cl.
CPC ............ *H01L 23/367* (2013.01); *H01L 21/56* (2013.01); *H01L 23/3128* (2013.01); *H01L 23/42* (2013.01); *H01L 23/49822* (2013.01)

(58) Field of Classification Search
CPC .......................................... H01L 23/373–3738
See application file for complete search history.

(56) References Cited

U.S. PATENT DOCUMENTS

| | | | | |
|---|---|---|---|---|
| 5,629,835 A | * | 5/1997 | Mahulikar | H01L 21/4828 174/257 |
| 6,414,847 B1 | * | 7/2002 | Hutchison | H01L 23/3677 257/E23.113 |
| 8,323,996 B2 | * | 12/2012 | Koller | H01L 23/492 257/E33.056 |
| 9,023,688 B1 | * | 5/2015 | Or-Bach | H01L 23/3677 438/584 |
| 9,117,991 B1 | * | 8/2015 | Olson | F21S 43/15 |
| 2005/0134507 A1 | * | 6/2005 | Dishongh | H01L 23/3677 257/E23.101 |
| 2005/0136640 A1 | * | 6/2005 | Hu | H01L 23/373 257/E23.102 |
| 2006/0065972 A1 | * | 3/2006 | Khan | H01L 23/50 257/E23.079 |
| 2006/0138622 A1 | * | 6/2006 | Lu | H01L 21/563 257/E23.092 |

(Continued)

OTHER PUBLICATIONS

International Search Report and Written Opinion—PCT/US2021/013176—ISA/EPO—May 19, 2021.

*Primary Examiner* — Nicholas J Tobergte
(74) *Attorney, Agent, or Firm* — Loza & Loza, LLP/Qualcomm

(57) ABSTRACT

A package that includes a first substrate, an integrated device coupled to the first substrate, a second substrate coupled to the integrated device, and an encapsulation layer located between the first substrate and the second substrate. The second substrate is configured to operate as a heat spreader. The second substrate is configured to be free of an electrical connection with the integrated device.

30 Claims, 16 Drawing Sheets

PROFILE VIEW

(56) References Cited

U.S. PATENT DOCUMENTS

| | | | |
|---|---|---|---|
| 2009/0108437 A1* | 4/2009 | Raymond | H01L 23/3735 257/713 |
| 2012/0007229 A1* | 1/2012 | Bartley | H01L 23/3677 438/122 |
| 2013/0333927 A1* | 12/2013 | Cho | H05K 3/42 174/262 |
| 2015/0255429 A1* | 9/2015 | Katkar | H01L 21/76898 257/774 |
| 2016/0293514 A1 | 10/2016 | Lin et al. | |
| 2016/0324031 A1* | 11/2016 | Fujiwara | B32B 9/007 |
| 2017/0162556 A1 | 6/2017 | Lin et al. | |
| 2019/0139854 A1* | 5/2019 | Wu | H01L 23/53209 |

\* cited by examiner

PROFILE VIEW

PROFILE VIEW

PROFILE VIEW

PACKAGE COMPRISING A SUBSTRATE CONFIGURED AS A HEAT SPREADER

FIELD

Various features relate to packages that include an integrated device, but more specifically to a package that includes an integrated device and a substrate that is configured as a heat spreader.

BACKGROUND

FIG. 1 illustrates a package 100 that includes a substrate 102, an integrated device 104, and an encapsulation layer 106. The substrate 102 includes a plurality of dielectric layers 120, a plurality of interconnects 122, and a plurality of solder interconnects 124. A plurality of solder interconnects 144 is coupled to the substrate 102 and the integrated device 104. The encapsulation layer 106 encapsulates the integrated device 104 and the plurality of solder interconnects 144. Heat dissipation for the package 100 is always a challenge, which can affect the performance of the package 100. There is an ongoing need to provide better performing packages.

SUMMARY

Various features relate to packages that include an integrated device, but more specifically to a package that includes an integrated device and a substrate that is configured as a heat spreader.

One example provides a package that includes a first substrate, an integrated device coupled to the first substrate, a second substrate coupled to the integrated device, and an encapsulation layer located between the first substrate and the second substrate. The second substrate is configured to operate as a heat spreader. The second substrate is configured to be free of an electrical connection with the integrated device.

Another example provides an apparatus that includes a first substrate, an integrated device coupled to the substrate, means for heat spreading coupled to the integrated device, and an encapsulation layer located between the first substrate and the means for heat spreading. The means for heat spreading is configured to be free of an electrical connection with the integrated device.

Another example provides a method for fabricating a package. The method provides a first substrate. The method couples an integrated device to the first substrate. The method couples a second substrate to the integrated device. The second substrate is configured to operate as a heat spreader. The second substrate is configured to be free of an electrical connection with the integrated device. The method forms an encapsulation layer between the first substrate and the second substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a first substrate, an integrated device coupled to the first substrate, a second substrate coupled to the integrated device, and an encapsulation layer located between the first substrate and the second substrate. The second substrate is configured to operate as a heat spreader. The second substrate is configured to be free of an electrical connection with the integrated device. The second substrate may have a second coefficient of thermal expansion (CTE) that is similar to (e.g., closely matches) the first coefficient of thermal expansion (CTE) of the first substrate. This configuration may provide a package with improved heat dissipation, while also reducing, minimizing and/or eliminating warpage of the package, due to the fact that the first substrate and the second substrate have similar CTEs. In some implementations, the CTEs of the first substrate and the second substrate may be similar to the CTE of the integrated device.

Exemplary Package Comprising a Substrate Configured as a Heat Spreader

Figure 1:
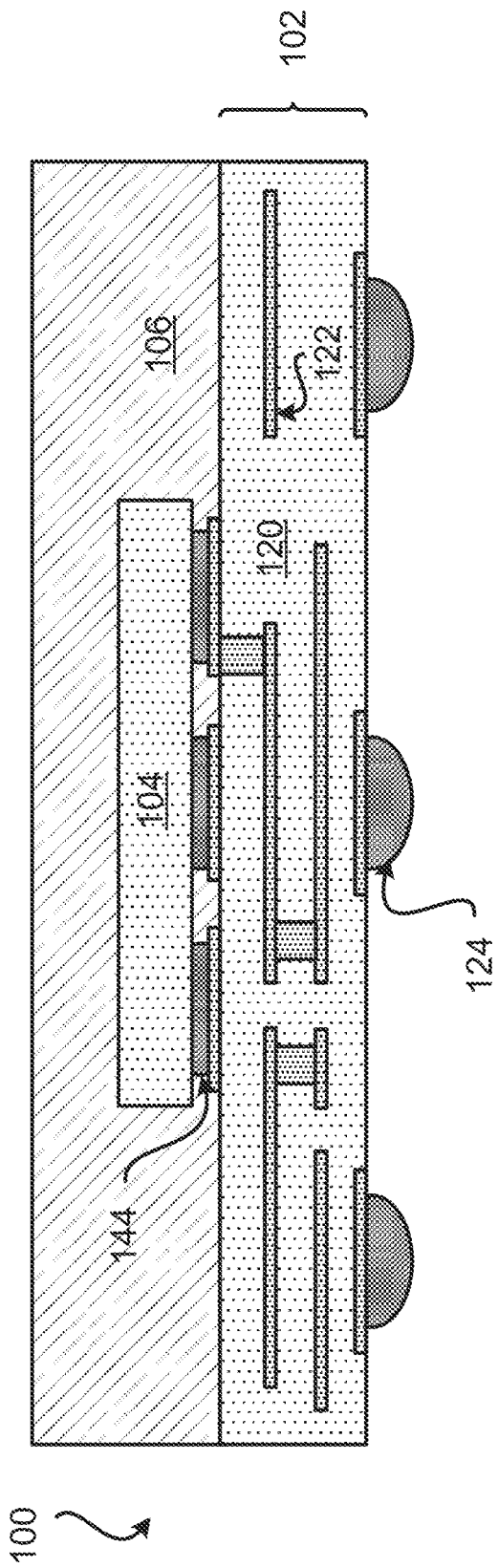
FIG. 1 illustrates a profile view of a package that includes an integrated device and a substrate.
Figure 2:
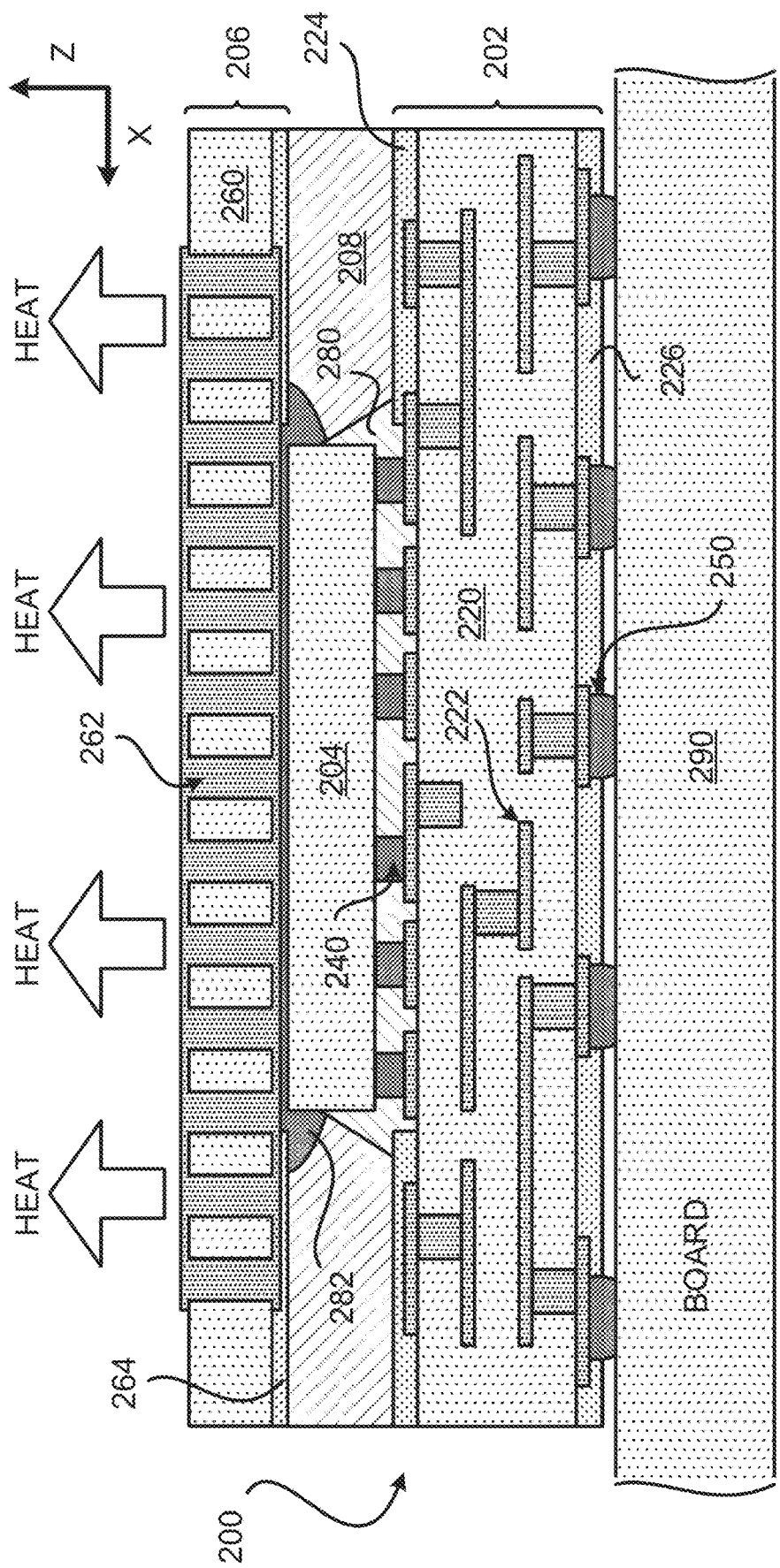
FIG. 2 illustrates a profile view of a package that includes a substrate configured as a heat spreader.

FIG. 2 illustrates a profile view of a package 200 that includes a substrate that is configured as heat spreader. The package 200 may be a mold embedded package (MEP). The package 200 is coupled to a board 290 (e.g., printed circuit board (PCB)) through a plurality of solder interconnects 250.

As shown in FIG. 2, the package 200 includes a first substrate 202, an integrated device 204, a second substrate 206, an encapsulation layer 208, an underfill 280 and a thermal interface material (TIM) 282. The integrated device 204 is coupled to the first substrate 202. The second substrate 206 is coupled to the integrated device 204. The encapsulation layer 208 is coupled to the first substrate 202 and the second substrate 206, such that the encapsulation layer 208 is located between the first substrate 202 and the second substrate 206. The second substrate 206 is configured to operate as a heat spreader. The second substrate 206 may be a means for heat spreading. The second substrate 206 may be an interposer. The second substrate 206 is configured to be free of an electrical connection with the integrated device 204. For example, the second substrate 206 is configured to not be electrically coupled to circuits of the integrated device 204.

The first substrate 202 may have a first coefficient of thermal expansion (CTE) that is approximately 7-15 part per million per degree Celsius (ppm/C). The second substrate 206 may have a second coefficient of thermal expansion (CTE) that is approximately 7-15 part per million per degree Celsius (ppm/C). The second CTE of the second substrate 206 may be similar to (e.g., closely match) the first CTE of the first substrate 202. Excessive mismatch of CTEs of different components of the package 200 can cause warpage of the package 200, which can cause the package to fail. When the first CTE of first substrate 202 and the second CTE of the second substrate 206 are similar (e.g., closely match), the warpage of the package 200 is reduced, minimized and/or eliminated, thereby providing a package that is more reliable and less likely to fail. Moreover, the first substrate 202 and the second substrate 206 may each have a CTE that is similar to (e.g., closely matches) the CTE of the integrated device 204. The integrated device 204 may have a CTE that is approximately 7 part per million per degree Celsius (ppm/C). The second CTE of the second substrate 206 may be specified by patterning the plurality of interconnects 262 with a particular design, and/or using specific types of materials for the dielectric layer 260.

There are many advantages and benefits to the second substrate 206. In addition to being configured as a heat spreader that has a CTE that can be configured to be similar to the CTE of the first substrate 202 and/or the CTE of the integrated device 204, the second substrate 206 can also be fabricated using an inexpensive process, thus providing an inexpensive component that can be configured as a heat spreader. As will be further described below, the second substrate 206 may be also be a relatively thin and balanced substrate structure that includes a dielectric layer and a plurality of interconnects (e.g., vias).

The first substrate 202 includes at least one dielectric layer 220, a plurality of interconnects 222, a first solder resist layer 224, and a second solder resist layer 226. The plurality of interconnects 222 is located (e.g., formed) in and/or over the at least one dielectric layer 220. The first substrate 202 may be a laminate substrate that includes dielectric layers and interconnects as described above. In some implementations, the first substrate 202 may include an organic substrate, glass and/or quartz.

The first solder resist layer 224 is located over a first surface (e.g., integrated device facing surface, top surface) of the first substrate 202. For example, the first solder resist layer 224 may be formed over the at least one dielectric layer 220. The second solder resist layer 226 is located over a second surface (e.g., board facing surface, bottom surface) of the first substrate 202. For example, the second solder resist layer 226 may be formed over the at least one dielectric layer 220. In some implementations, the first solder resist layer 224 and/or the second solder resist layer 226 may be optional.

The integrated device 204 is coupled to the first substrate 202 through a plurality of interconnects 240. The plurality of interconnects 240 may be coupled to interconnects from the plurality of interconnects 222. The plurality of interconnects 240 may include pillars, which may be considered part of the integrated device 204. In some implementations, the plurality of interconnects 240 may be coupled to the plurality of interconnects 222 through solder interconnects. The integrated device 204 includes a front side (which may be an active side) and a back side. The integrated device 204 is coupled to the first substrate 202 and the second substrate 206 such that the front side of the integrated device 204 faces the first substrate 202, and the back side of the integrated device 204 faces the second substrate 206. An underfill 280 may be located between the integrated device 204 and the first substrate 202. The underfill 280 may laterally surround the plurality of interconnects 240. The underfill 280 may also be located over a side portion of the integrated device 204.

The encapsulation layer 208 is coupled to the first substrate 202 and the second substrate 206 such that the encapsulation layer 208 is located between the first substrate 202 and the second substrate 206. The encapsulation layer 208 may be located over the first solder resist layer 224 of the first substrate 202. The encapsulation layer 208 may be coupled to the first substrate 202 and the second substrate 206 such that the encapsulation layer 208 at least laterally encapsulates the integrated device 204. The encapsulation layer 208 may include a mold, a resin, a polymer and/or an epoxy.

The second substrate 206 is coupled to the back side of the integrated device 204 through the TIM 282. The TIM 282 may be an adhesive material that has a high thermal conductivity (e.g., greater than 0.5 W/mK (Watts per meter Kelvin)). The TIM 282 may have a CTE of approximately 20-200 ppm/C. The TIM 282 may be coupled to the back side of the integrated device 204 and to the second substrate 206. The TIM 282 may be used to ensure that there is no void or very little voids between the integrated device 204 and the second substrate 206. Reducing, minimizing and/or eliminating voids is important because a void can act as an insulator, and thus a void can reduce the heat dissipating and/or heat spreading effectiveness of the second substrate 206. Using the TIM 282 helps reduce, minimize and/or eliminate voids, which helps improve the heat dissipating and/or heat spreading capabilities of the second substrate 206. The TIM 282 may be coupled to a side portion of the integrated device 204. In some implementations, the second substrate 206 may be touching the integrated device 204 (e.g., touching the back side of the integrated device 204).

The second substrate 206 includes a dielectric layer 260, a plurality of interconnects 262, and at least one solder resist layer 264. The second substrate 206 may be an interposer. As mentioned above, the second substrate 206 may be configured as a heat spreader and/or a heat dissipator. The second substrate 206 may be a means for heat spreading. In particular, the plurality of interconnects 262 may be configured to operate as a heat spreader and/or heat dissipator. The plurality of interconnects 262 is configured to be free of an electrical connection with the integrated device 204 (e.g., free of electrical connection with the integrated device 204, when the integrated device 204 is in operation) and/or the first substrate 202. The plurality of interconnects 262 may include vias, traces, and/or pads. The second substrate 206 may include a different number of interconnects (e.g., different number of vias). In some implementations, some vias may be fabricated and combined to form larger sized vias. In some implementations, the vias of the plurality of interconnects 262 may include vias that are separate from one another, such that two or more vias are not coupled together. In some implementations, one or more vias of the plurality of interconnects 262 may include vias that are recessed from a surface (e.g., bottom surface, top surface) of the second substrate (e.g., 206). The dielectric layer 260 may include glass, silicon, quartz, and/or combinations thereof.

The solder resist layer 264 may located on a surface of the second substrate 206 that faces the integrated device 204 and/or the first substrate 202. The solder resist layer 264 may be configured to provide improved adhesion. The solder resist layer 264 is coupled to the dielectric layer 260 and the encapsulation layer 208.

The overall thickness of the package 200 that includes the second substrate 206 is substantially thinner than other packages with other types of heat spreader. In some implementations, the package 200 and the second substrate 206 may have an overall thickness of approximately 1 millimeter (mm) or less (e.g., 1000 micrometers (μm) or less). In some implementations, the plurality of solder interconnects 250 may have a thickness of approximately 200 micrometers or less, the first substrate 202 may have a thickness of approximately 400 micrometers or less, the integrated device 204 and the encapsulation layer 208 may each have a thickness of approximately 200 micrometers or less, and the second substrate 206 may have a thickness of approximately 200 micrometers or less.

FIG. 2 illustrates that the second substrate 206 includes vias that include approximately vertical side walls. However, different implementations may include vias with different shapes and/or configurations.

Figure 3:
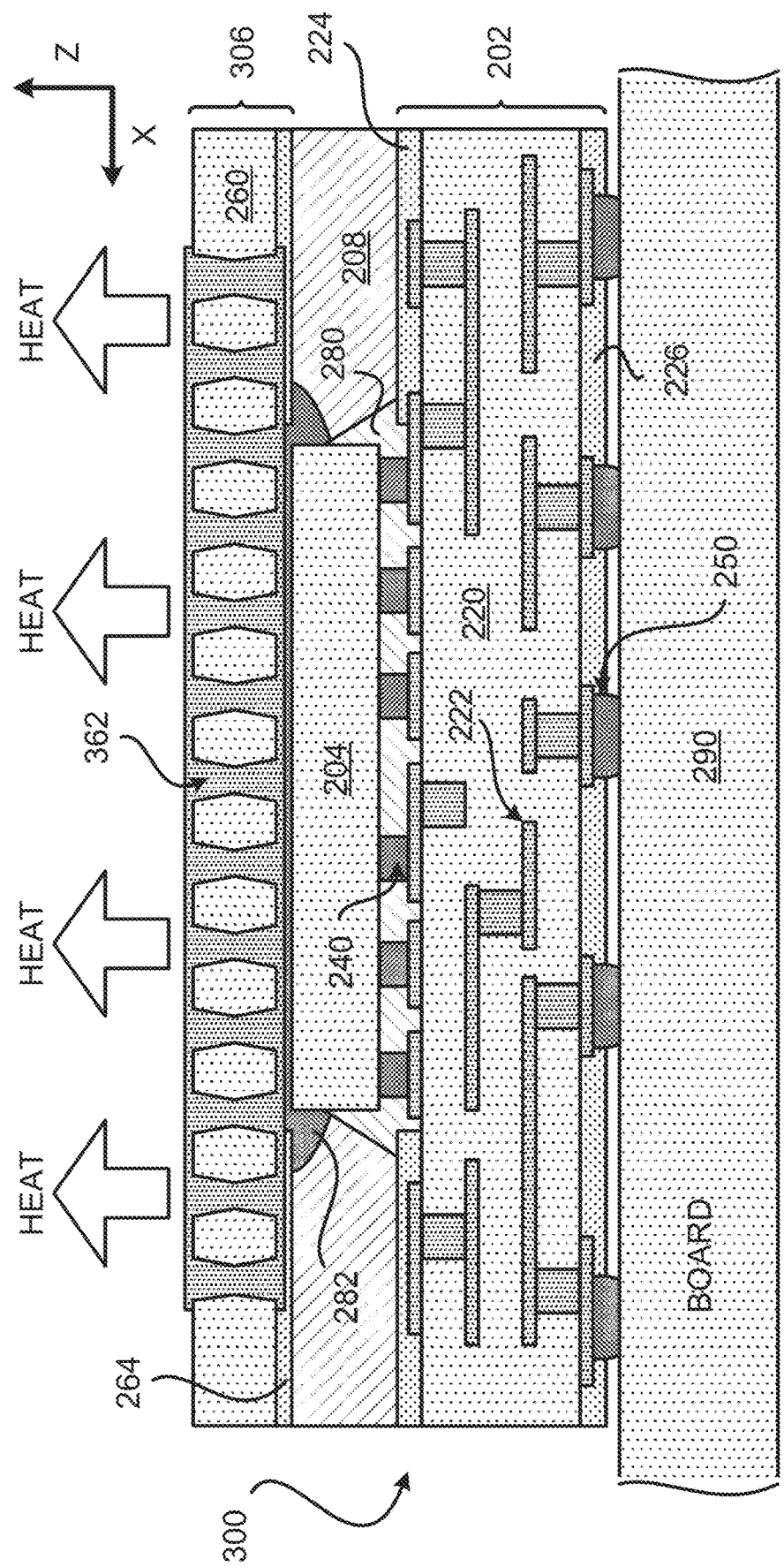
FIG. 3 illustrates a profile view of a package that includes another substrate configured as a heat spreader.

FIG. 3 illustrates a package 300 that includes a substrate that is configured as a heat spreader. The package 300 is similar to the package 200, and includes similar components as the package 200. The package 300 includes a second substrate 306 configured as a heat spreader. The package 300 includes the first substrate 202, the integrated device 204, a second substrate 306, the encapsulation layer 208, the underfill 280 and the thermal interface material (TIM) 282. The second substrate 306 may be configured to be free of an electrical connection with the integrated device 204 and/or the first substrate 202.

The second substrate 306 is similar to the second substrate 206 of the package 200. The second substrate 306 includes the dielectric layer 260, a plurality of interconnects 362, and at least one solder resist layer 264. The second substrate 306 may be an interposer. As mentioned above, the second substrate 306 may be configured as a heat spreader and/or a heat dissipator. The second substrate 306 may be a means for heat spreading. In particular, the plurality of interconnects 362 may be configured to operate as a heat spreader and/or heat dissipator. The plurality of interconnects 362 is configured to be free of an electrical connection with the integrated device 204 and/or the first substrate 202. The plurality of interconnects 362 may include vias, traces, and/or pads.

As shown in FIG. 3, the vias from the plurality of interconnects 362 include a diagonal side wall. Thus, the vias from the plurality of interconnects 362 of FIG. 3 may have a different shape and/or design than the vias from the plurality of interconnect 262 of FIG. 2. The difference in the shapes of the vias may be due to a different fabrication process that is used to fabricate the vias in FIG. 2 and the vias of FIG. 3.

Similar to FIG. 2, the second substrate 306 may have a second coefficient of thermal expansion (CTE) that is approximately 7-15 part per million per degree Celsius (ppm/C). The second CTE of the second substrate 206 may be similar to (e.g., closely match) the first CTE of the first substrate 202. Moreover, the first substrate 202 and the second substrate 306 may each have a CTE that is similar to (e.g., closely matches) the CTE of the integrated device 204.

Figure 4:
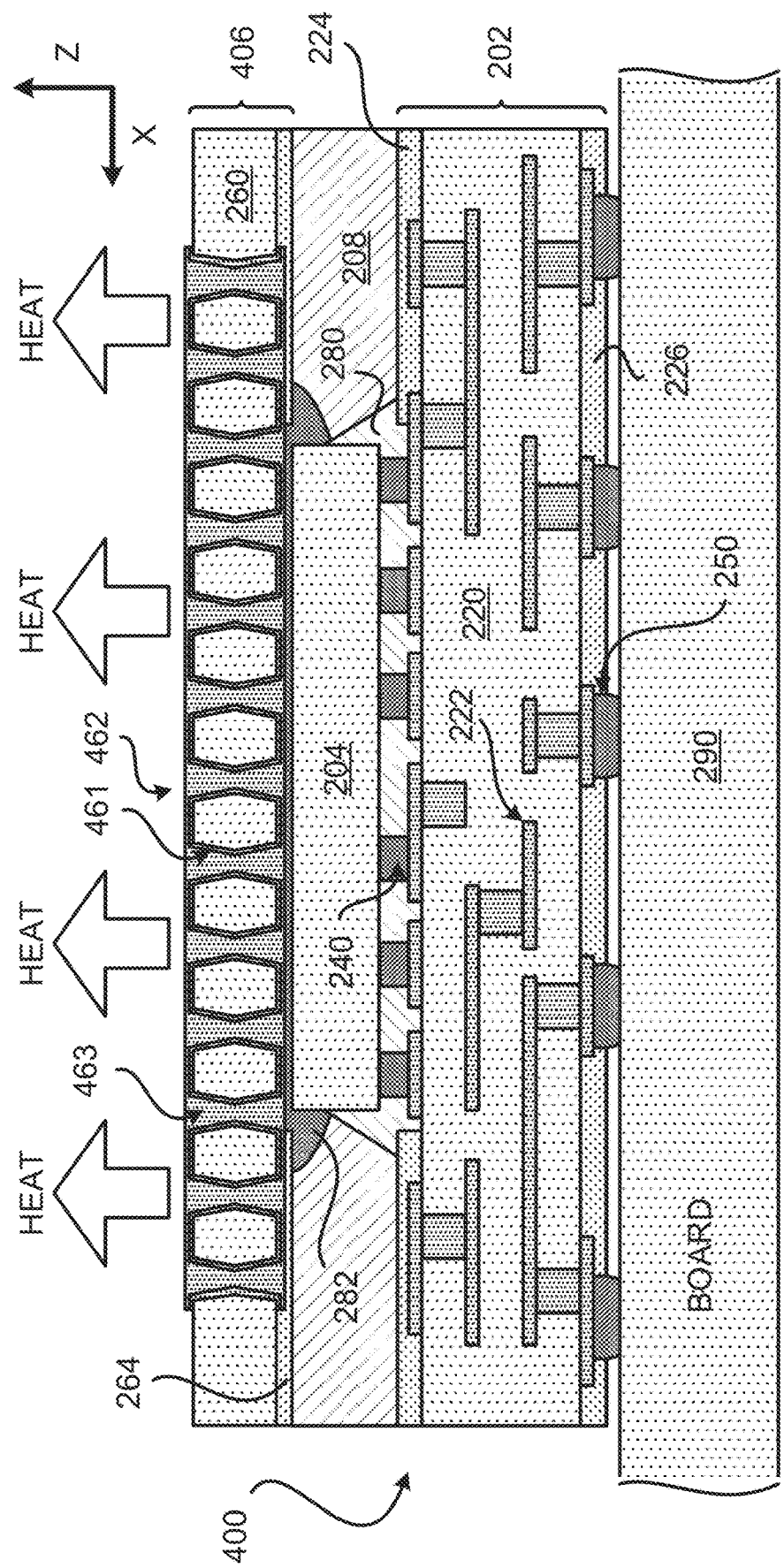
FIG. 4 illustrates a profile view of a package that includes another substrate configured as a heat spreader.

FIG. 4 illustrates a package 400 that includes a substrate that is configured as a heat spreader. The package 400 is similar to the package 300, and includes similar components as the package 300. The package 400 includes a second substrate 406 configured as a heat spreader. The package 400 includes the first substrate 202, the integrated device 204, a second substrate 406, the encapsulation layer 208, the underfill 280 and the thermal interface material (TIM) 282. The second substrate 406 may be configured to be free of an electrical connection with the integrated device 204 and/or the first substrate 202.

The second substrate 406 is similar to the second substrate 406 of the package 300. In some implementations, the second substrate 406 may be a more detailed representation of the second substrate 306. The second substrate 406 includes the dielectric layer 260, a plurality of interconnects 342, and at least one solder resist layer 264. The second substrate 406 may be an interposer. As mentioned above, the second substrate 406 may be configured as a heat spreader and/or a heat dissipator. The second substrate 406 may be a means for heat spreading. In particular, the plurality of interconnects 462 may be configured to operate as a heat spreader and/or heat dissipator. The plurality of interconnects 462 is configured to be free of an electrical connection with the integrated device 204 and/or the first substrate 202. The plurality of interconnects 462 may include vias, traces, and/or pads.

Similar to FIG. 2, the second substrate 406 may have a second coefficient of thermal expansion (CTE) that is approximately 7-15 part per million per degree Celsius (ppm/C). The second CTE of the second substrate 206 may be similar to (e.g., closely match) the first CTE of the first substrate 202. Moreover, the first substrate 202 and the second substrate 406 may each have a CTE that is similar to (e.g., closely matches) the CTE of the integrated device 204.

As shown in FIG. 4, the vias from the plurality of interconnects 462 include a diagonal side wall. One or more interconnects (e.g., vias) from the plurality of interconnects 462 may be defined by one or more metal layers. For example, a via may be defined by a first metal layer 461 (e.g., first copper layer) and a second metal layer 463 (e.g., second copper layer).

Figure 5:
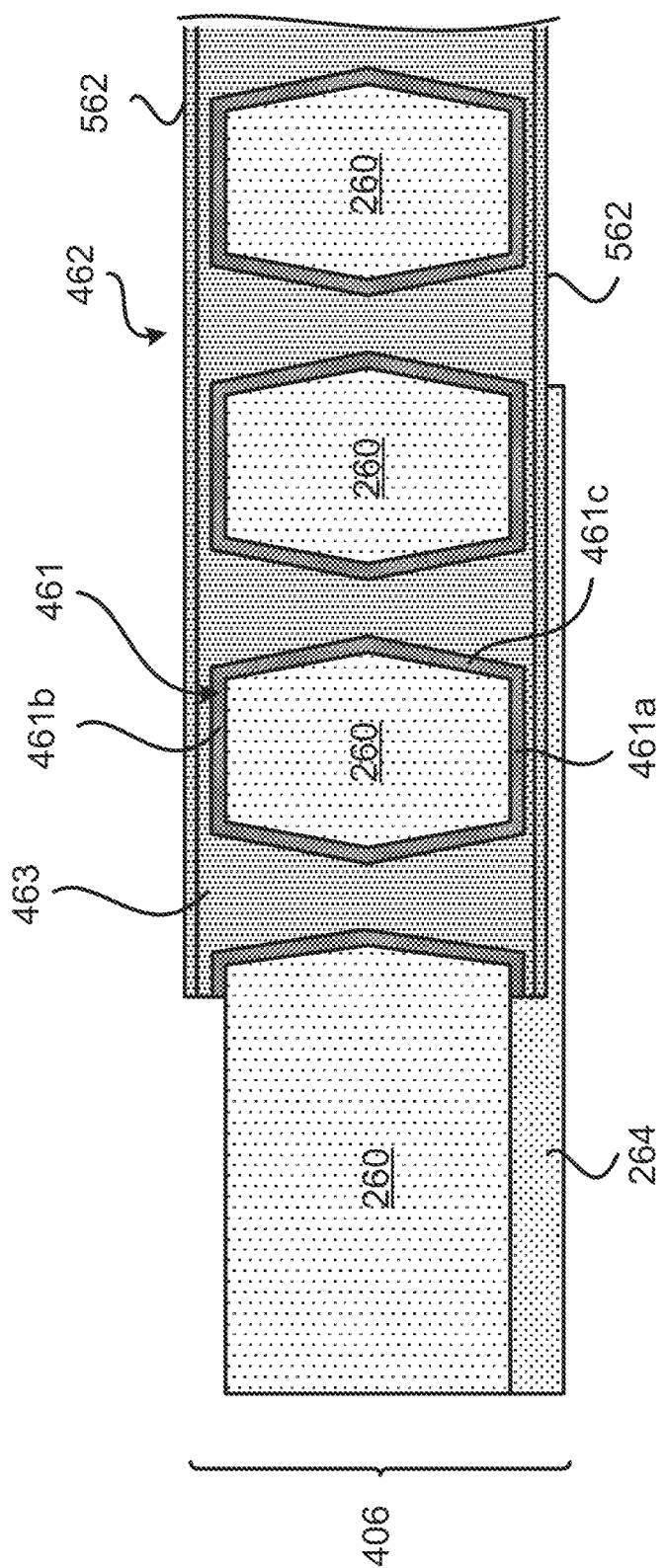
FIG. 5 illustrates a close-up view of a substrate configured as a heat spreader.

FIG. 5 illustrates a close-up view of the second substrate 406. As mentioned above, the second substrate 406 includes the dielectric layer 260, the plurality of interconnects 462 and at least one solder resist layer 264. The plurality of interconnects 462 may be defined by one or more metal layers. For example, an interconnect (e.g., via) from the plurality of interconnects 462 may be defined by the first metal layer 461 and the second metal layer 463. The first metal layer 461 may include metal layer 461a located over a first surface (e.g., bottom surface) of the dielectric layer 260, a metal layer 461b located over a second surface (e.g., top surface) and a metal layer 461c located over a side surface of the dielectric layer 260. The first metal layer 461 may be a seed metal layer. The metal layers (461a, 461b, 461c) may be a continuous and/or a contiguous metal layer. In some implementations, the metal layers (461a, 461b, 461c) may be separate metal layers. In some implementations, the second substrate 406 may include a metal layer 562 that is formed over the bottom side and/or the top side of the plurality of interconnects 462. The metal layer 562 may include nickel (Ni). The dielectric layer 260 may be formed over the metal layer 562 and/or the plurality of interconnects 462. The metal layer 562 may be implemented in any of substrates (e.g., second substrate 206) described in the disclosure.

Having described various different packages with different substrates configured as heat spreader, a sequence for fabricating a substrate configured as heat spreader will now be described below.

Exemplary Sequence for Fabricating a Substrate Configured as a Heat Spreader

Figure 6A:
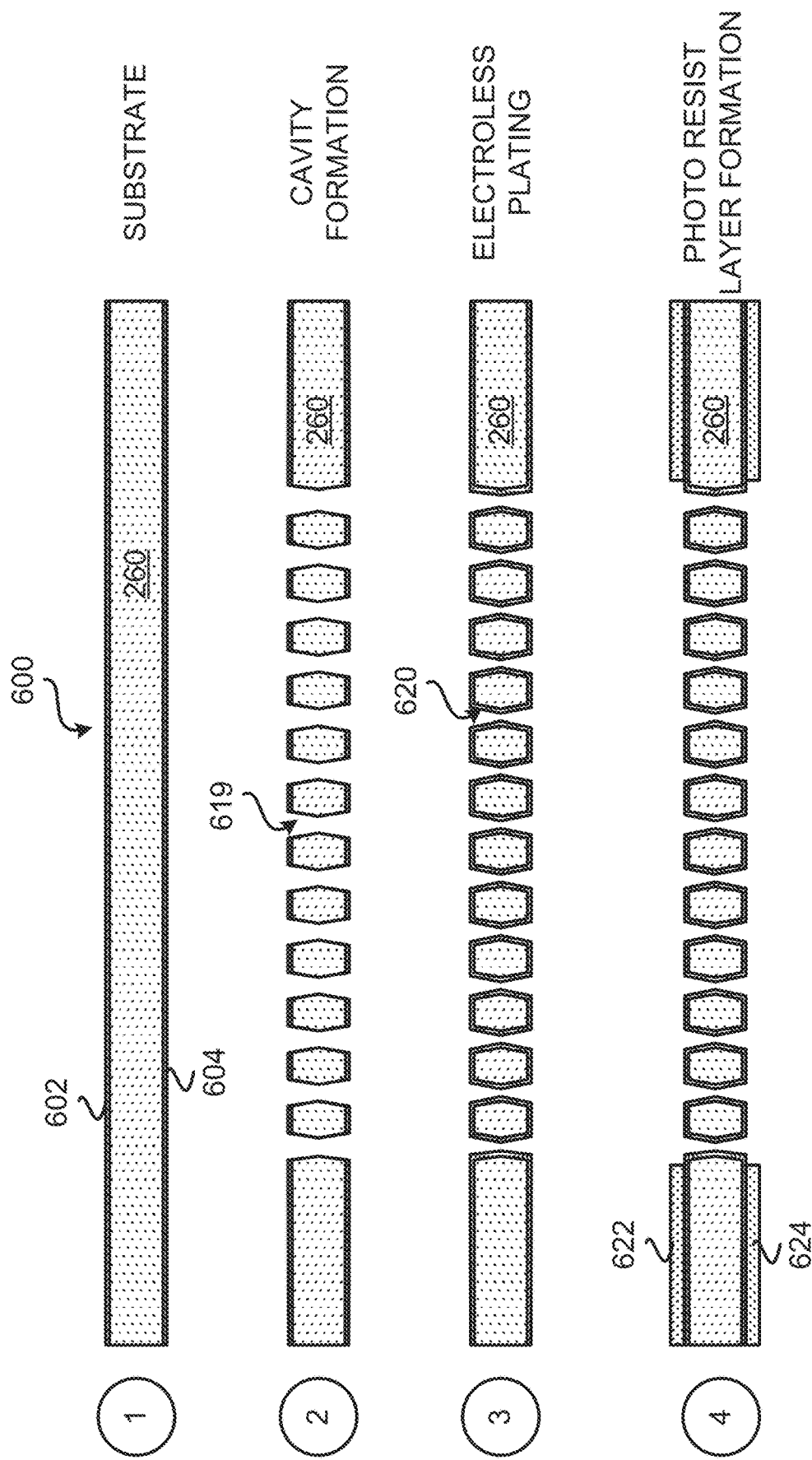
FIG. 6 (comprising FIGS. 6A-6B) illustrates an exemplary sequence for fabricating a substrate configured as a heat spreader.
Figure 6B:
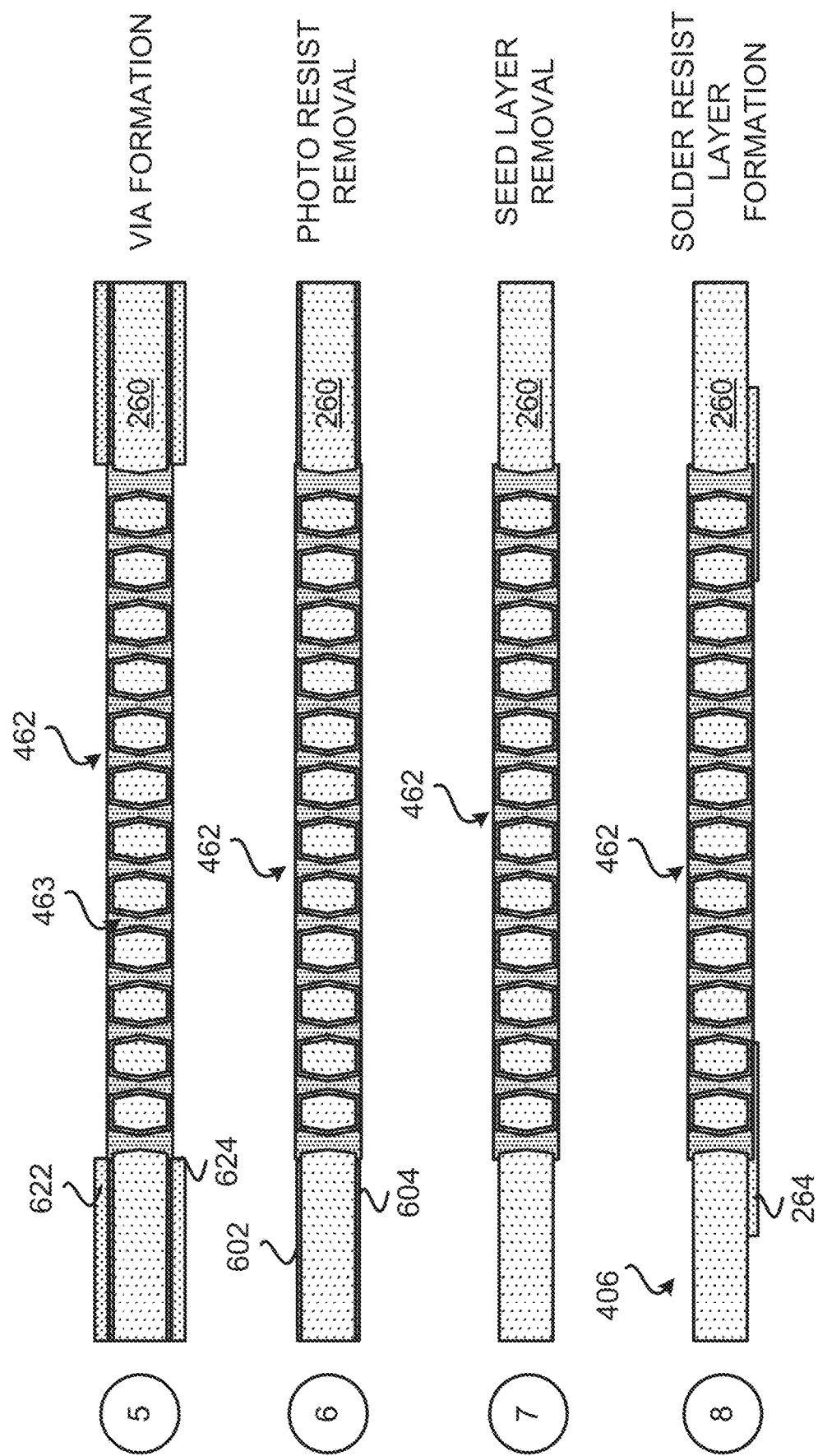

FIG. 6 (which includes FIGS. 6A-6B) illustrates an exemplary sequence for providing or fabricating a substrate configured as a heat spreader. In some implementations, the sequence of FIGS. 6A-6B may be used to provide or fabricate the second substrate 406 of FIG. 4, or any of the substrates described in the disclosure.

It should be noted that the sequence of FIGS. 6A-6B may combine one or more stages in order to simplify and/or clarify the sequence for providing or fabricating the substrate configured as a heat spreader. In some implementations, the order of the processes may be changed or modified. In some implementations, one or more of processes may be replaced or substituted without departing from the spirit of the disclosure.

Stage 1, as shown in FIG. 6A, illustrates a state after a substrate 600 is provided. The substrate 600 includes a dielectric layer 260, a metal layer 602 and a metal layer 604. The metal layer 602 and/or the metal layer 604 may include copper. The metal layer 602 may correspond to the metal layer 461b of FIG. 4. The metal layer 604 may correspond to the metal layer 461a of FIG. 4. The metal layer 602 and the metal layer 604 may be seed layers.

Stage 2 illustrates a state after cavities 619 are formed in the substrate 600. The cavities 619 are formed through the metal layer 602, the dielectric layer 260 and the metal layer 604. A laser process (e.g., laser ablation) may be used to form the cavities 619.

Stage 3 illustrates a state after a metal layer 620 is formed over the side wall of the cavities 619. A plating process (e.g., electroless plating process) may be used to form the metal layer 620 over the side wall of the cavities 619. The metal layer 620 may correspond to the metal layer 461c of FIG. 4.

Stage 4 illustrates a state after photo resist layers are formed over the substrate 600. A first photo resist layer 622 may be formed over a surface (e.g., top surface) of the substrate 600, and a second photo resist layer 624 may be formed over a surface (e.g., bottom surface) of the substrate 600.

Stage 5, as shown in FIG. 6B, illustrates a state after a second metal layer 463 is formed over the substrate 600. The second metal layer 463 may be formed using a plating process. The second metal layer 463 may be formed over the metal layer 620, the metal layer 602 and/or the metal layer 604. The second metal layer 463 may be located in the cavities 619 and/or the over the substrate 600. Stage 5 illustrates the plurality of interconnects 462 that is defined by the second metal layer 463, the metal layer 620, the metal layer 602 and/or the metal layer 604.

Stage 6 illustrates a state after the photo resist layers (e.g., 622, 624) are removed from the substrate 600.

Stage 7 illustrates a state after portions of the metal layer 602 and portions of the metal layer 604 are removed. In some implementations, any metal layer 602 or any metal layer 604 that is not covered by the second metal layer 463 is removed.

Stage 8 illustrates a state after the solder resist layer 264 is formed over the dielectric layer 260. A plating process may be used to form at least one solder resist layer 264. Stage 8 may illustrate the second substrate 406 that includes the dielectric layer 260, the plurality of interconnects 462 (which may be defined by the first metal layer 461 and the second metal layer 463) and the at least one solder resist layer 264.

In some implementations, a metal layer (e.g., 562) may be formed over a bottom side and/or top side of the plurality of interconnects 462. The metal layer (e.g., 562) may be formed before the at least one solder resist layer 264 is formed. The solder resist layer 264 may be formed over the metal layer (e.g., 562). It is noted that the sequence and process for fabricating the second substrate 406 may also be used to fabricate the first substrate 202. In some implementations, the first substrate 202 may be fabricated using a different sequence and/or process.

Figure 7:
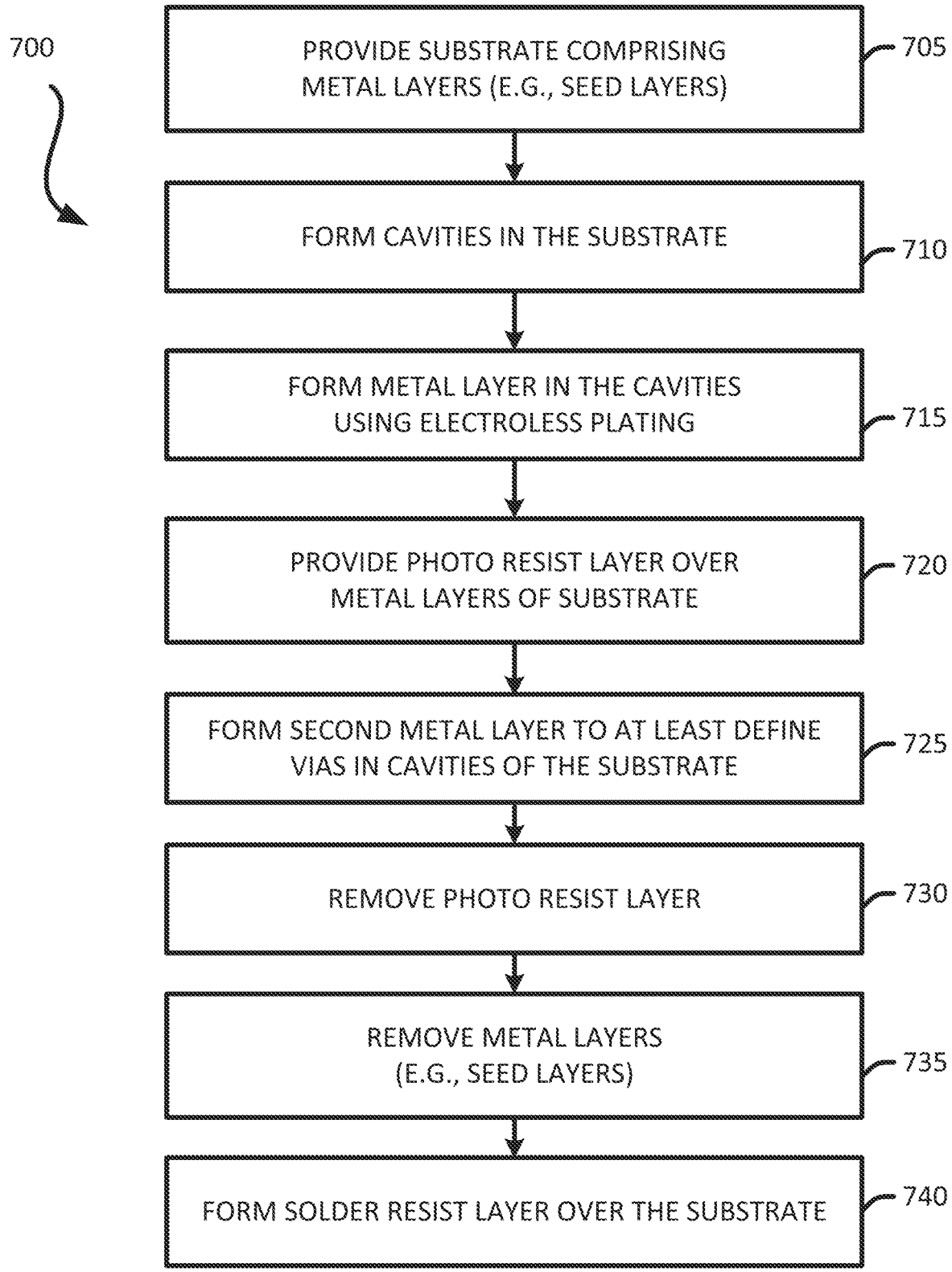
FIG. 7 illustrates an exemplary flow diagram of a method for fabricating a substrate configured as a heat spreader.

Exemplary Flow Diagram of a Method for Fabricating a Substrate Configured as a Heat Spreader In some implementations, fabricating a substrate configured as a heat spreader includes several processes. FIG. 7 illustrates an exemplary flow diagram of a method 700 for providing or fabricating a substrate configured as a heat spreader. In some implementations, the method 700 of FIG. 7 may be used to provide or fabricate the second substrate of FIG. 4 described in the disclosure. However, the method 700 may be used to provide or fabricate any of the substrates described in the disclosure.

It should be noted that the sequence of FIG. 7 may combine one or more processes in order to simplify and/or clarify the method for providing or fabricating a substrate configured as a heat spreader. In some implementations, the order of the processes may be changed or modified.

The method provides (at 705) a substrate (e.g., 600) that includes a dielectric layer (e.g., 260) and metal layers (e.g., 602, 604). The substrate 600 may be fabricated or provided from a supplier. The metal layer 602 and/or the metal layer 604 may include copper. The metal layer 602 may correspond to the metal layer 461b of FIG. 4. The metal layer 604 may correspond to the metal layer 461a of FIG. 4. The metal layer 602 and the metal layer 604 may be seed layers. Stage 1 of FIG. 6A illustrates and describes an example of providing a substrate that includes metal layers.

The method forms (at 710) several cavities (e.g., 619) in the substrate (e.g., 600). The cavities 619 may be formed through the metal layer 602, the dielectric layer 260 and the metal layer 604. A laser process (e.g., laser ablation) may be used to form the cavities 619. Stage 2 of FIG. 6A illustrates and describes an example of cavity formation.

The method forms (at 715) a metal layer (e.g., 620) in the cavities (e.g., 619) of the substrate (e.g., 600). The metal layer 620 may be formed over the side wall of the cavities 619. A plating process (e.g., electroless plating process) may be used for form the metal layer 620 over the side wall of the cavities 619. The metal layer 620 may correspond to the metal layer 461c of FIG. 4. Stage 3 of FIG. 6A illustrates and describes an example of metal formation in the cavity.

The method provides (at 720) photo resist layers (e.g., 622, 624) over the substrate 600. A first photo resist layer 622 may be formed over a surface (e.g., top surface) of the substrate 600, and a second photo resist layer 624 may be formed over a surface (e.g., bottom surface) of the substrate 600. Stage 4 of FIG. 6A illustrates and describes an example of providing photo resist layers.

The method forms (at 725) a second metal layer (e.g., 463) over the substrate 600. The second metal layer 463 may be formed using a plating process. The second metal layer 463 may be formed over the metal layer 620, the metal layer 602 and/or the metal layer 604. The second metal layer 463 may be located in the cavities 619 and/or the over the substrate 600. Forming the metal layer may define and/or form the plurality of interconnects 462 (e.g., vias). The plurality of interconnects 462 may be defined by the second metal layer 463, the metal layer 620, the metal layer 602 and/or the metal layer 604. Stage 5 of FIG. 6B illustrates and describes an example of providing a second metal layer to define vias.

The method removes (at 730) the photo resist layers (e.g., 622, 624). Stage 6 of FIG. 6B illustrates and describes an example of the photo resist layers (e.g., 622, 624) being removed from the substrate 600.

The method removes (at 735) one or more metal layers (e.g., 602, 604) from the substrate. In some implementations, any metal layer 602 or any metal layer 604 that is not covered by the second metal layer 463 is removed. The metal layer 602 and the metal layer 604 may be seed layers. Stage 7 of FIG. 6B illustrates and describes an example of the metal (e.g., 602, 604) being removed from the substrate 600.

The method forming (at 740) at least one the solder resist layer (e.g., 264) over the dielectric layer 260. A plating process may be used to form at least one solder resist layer 264. Stage 8 of FIG. 6B illustrates an example of forming the at least one solder resist layer 264.

In some implementations, a metal layer (e.g., 562) may be formed over a bottom side and/or top side of the plurality of interconnects 462. The metal layer (e.g., 562) may be formed before the at least one solder resist layer 264 is formed. The metal layer 562 may include nickel (Ni).

Exemplary Sequence for Fabricating a Package that Includes a Substrate Configured as a Heat Spreader FIG. 8 (which includes FIGS. 8A-8D) illustrates an exemplary sequence for providing or fabricating a package that includes a substrate configured as a heat spreader. In some implementations, the sequence of FIGS. 8A-8D may be used to provide or fabricate the package 300 that includes the second substrate 306 of FIG. 3, or any of the packages described in the disclosure.

It should be noted that the sequence of FIGS. 8A-8D may combine one or more stages in order to simplify and/or clarify the sequence for providing or fabricating the package that includes a substrate configured as a heat spreader. In some implementations, the order of the processes may be changed or modified. In some implementations, one or more of processes may be replaced or substituted without departing from the spirit of the disclosure. The sequence of FIGS. 8A-8D may be used to fabricate one package or several packages at a time (as part of a wafer).

Figure 8A:
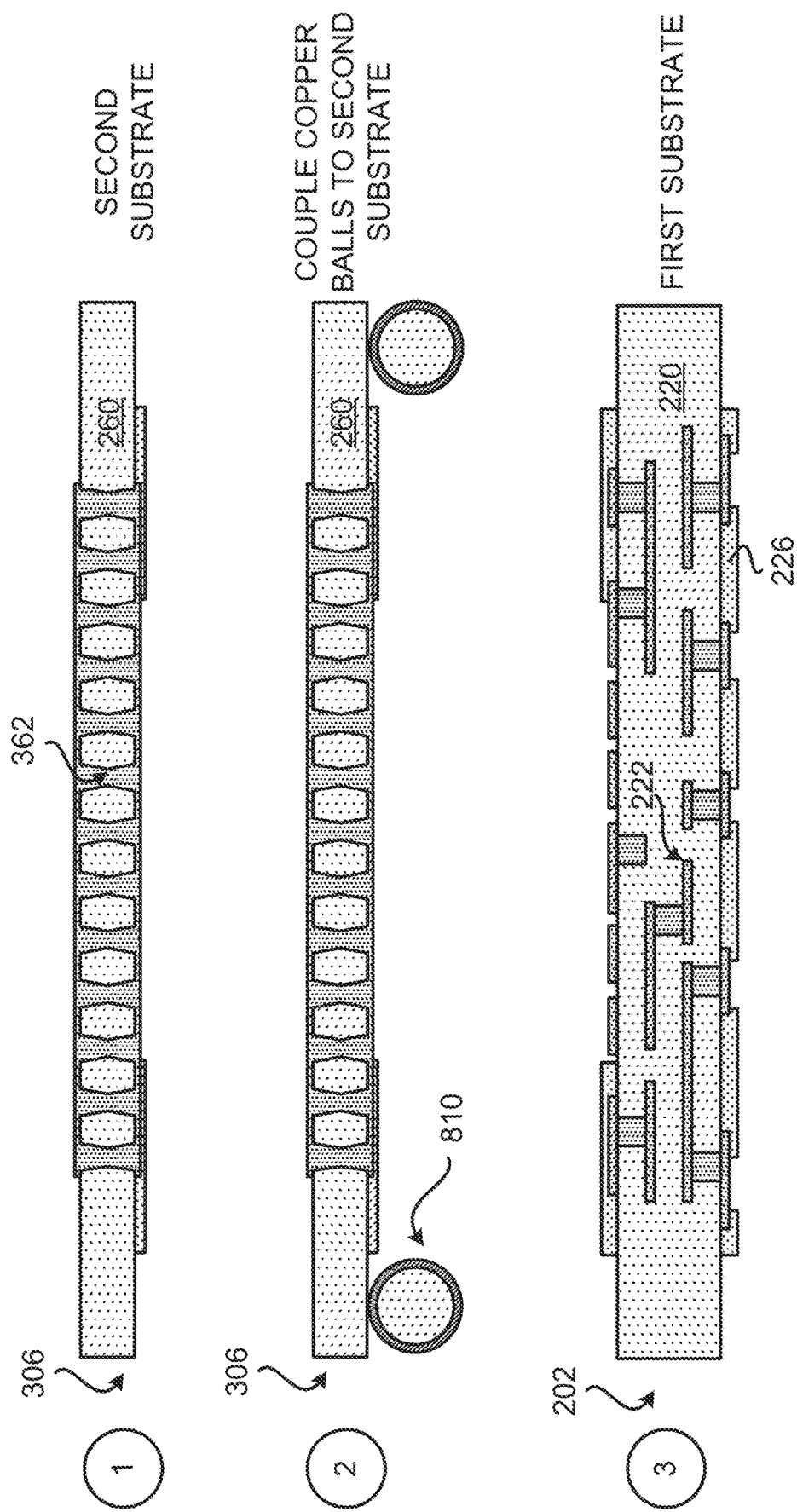
FIG. 8 (comprising FIGS. 8A-8D) illustrates an exemplary sequence for fabricating a package that includes a substrate configured as a heat spreader.

Stage 1, as shown in FIG. 8A, illustrates a state after the second substrate 306 is provided. The second substrate 306 includes the dielectric layer 260, the plurality of interconnects 362, and the at least one solder resist layer 264. The second substrate 306 may be provided by a supplier or fabricated using a process as described in FIGS. 6A-6B.

Stage 2 illustrates a state after copper balls 810 are coupled to the second substrate 306. The copper balls 810 may include copper core balls (CCB). The copper balls 810 may include solder. The copper balls 810 may be coupled to a bottom surface of the second substrate 306. The copper balls 810 may be coupled to the at least one solder resist layer 264 of the second substrate 306. The copper balls 810 may be coupled near the edge and/or perimeter of the second substrate 306.

Stage 3 illustrates a state after the first substrate 202 is provided. The first substrate 202 may be provided by a supplier or fabricated. A process similar to the process shown in FIGS. 6A-6B may be used to fabricate the first substrate 202. However, different implementations may use different processes to fabricate the first substrate 202. Examples of processes that may be used to fabricate the first substrate 202 include semi-additive process (SAP) and modified semi-additive process (mSAP). The first substrate 202 may be a laminated substrate. The first substrate 202 includes at least one dielectric layer 220 and a plurality of interconnects 222.

Figure 8B:
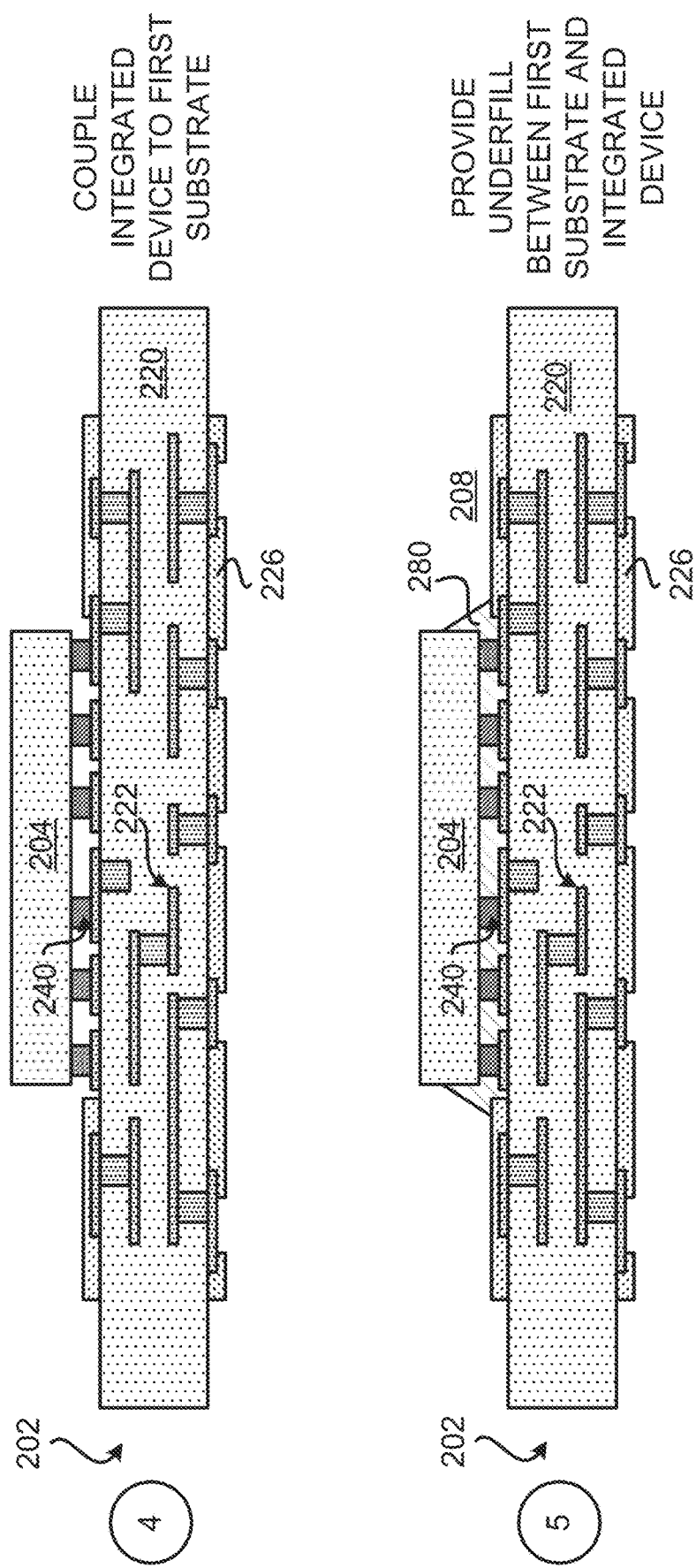

Stage 4, as shown in FIG. 8B, illustrates a state after the integrated device 204 is coupled to the first substrate 202. The integrated device 204 is coupled to the first substrate 202 through the plurality of interconnects 240. The plurality of interconnects 240 may be coupled to interconnects from the plurality of interconnects 222 of the first substrate 202. The plurality of interconnects 240 may be coupled to interconnects from the plurality of interconnects 222 through solder interconnects. The integrated device 204 may be coupled to the first substrate 202 such that the front side (e.g., active side) of the integrated device 204 is facing the first substrate 202.

Stage 5 illustrates a state after an underfill 280 is formed between the integrated device 204 and the first substrate 202. The underfill 280 may be formed such that the underfill 280 is coupled to the integrated device 204 and the first substrate 202.

Figure 8C:
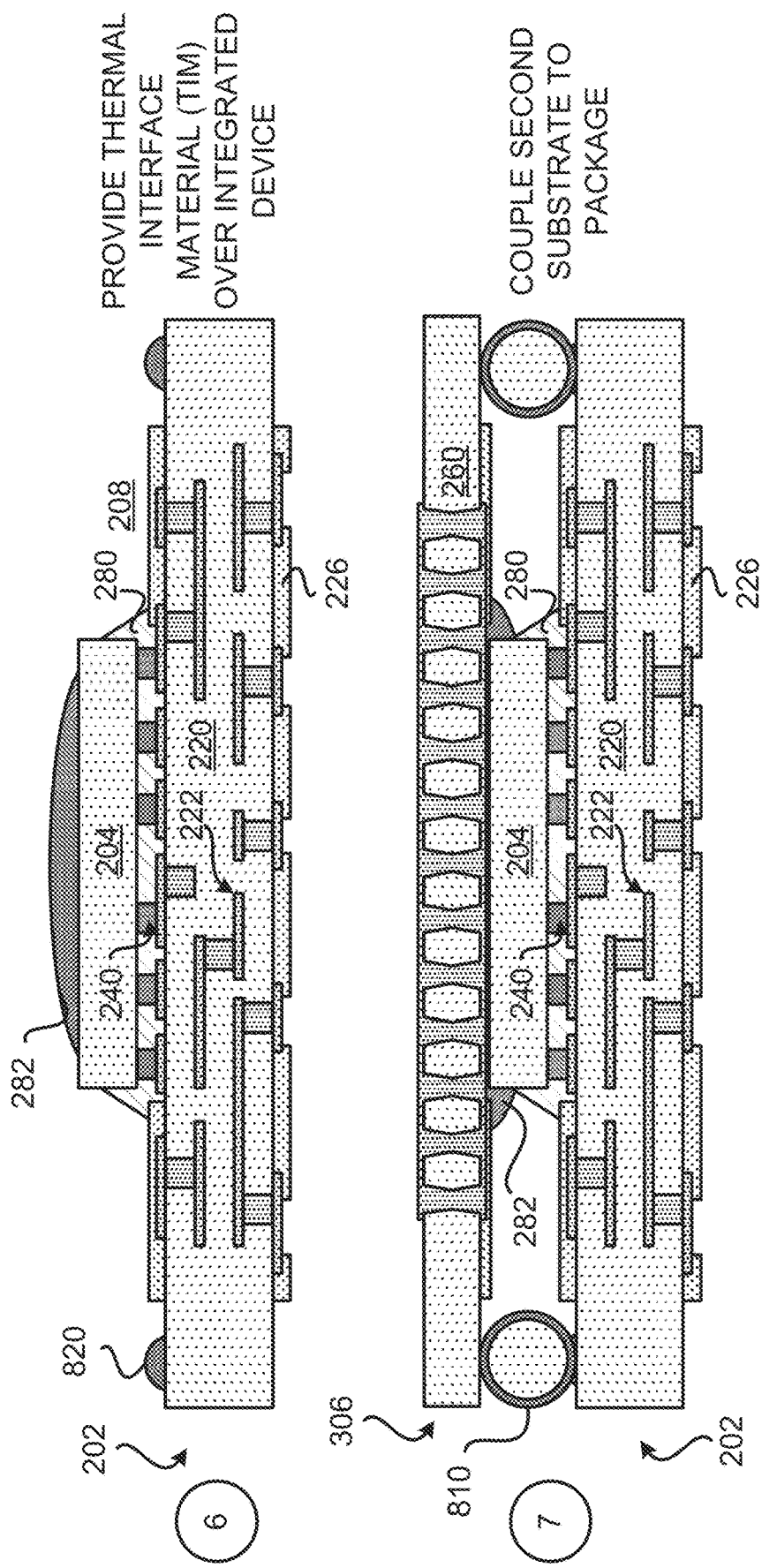

Stage 6, as shown in FIG. 8C, illustrates a state after the TIM 282 is provided over the integrated device 204. The TIM 282 may be provided over the integrated device 204 such that the TIM 282 is coupled to the back side of the integrated device 204. Stage 6 also illustrates a solder interconnect 820 being provided over the first substrate 202. The TIM 282 may be a snap curable TIM.

Stage 7 illustrates a state after the second substrate 306 with the copper balls 810 is coupled to the first substrate 202 and the integrated device 204. The second substrate 306 is coupled to the integrated device 204 through the TIM 282. In particular, the second substrate 206 is coupled to the integrated device 204 such that the back side of the integrated device 204 faces the second substrate 306. The copper balls 810 may be coupled to the first substrate 202 through the solder interconnect 820.

Figure 8D:
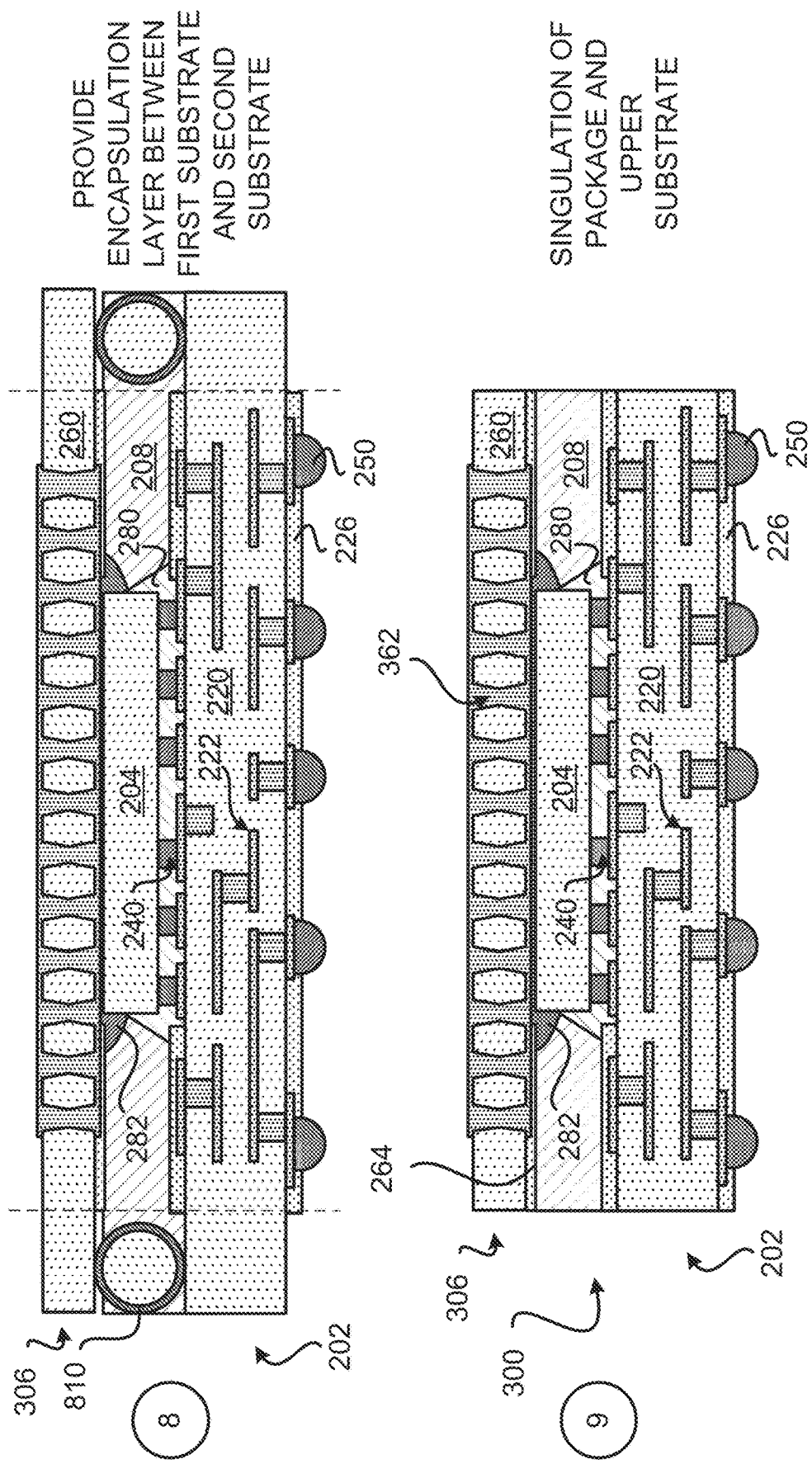

Stage 8, as shown in FIG. 8D, illustrates a state after the encapsulation layer 208 is provided between the first substrate 202 and the second substrate 206, such that the encapsulation layer 208 is coupled to the first substrate 202 and the second substrate 206. The encapsulation layer 208 laterally surrounds the integrated device 204. The encapsulation layer 208 may also encapsulate at least part of the copper balls 810. Stage 8 may also illustrate a state after the plurality of solder interconnects 250 is coupled to the first substrate 202. The process of forming and/or disposing the encapsulation layer 208 may include using a compression and transfer molding process, a sheet molding process, or a liquid molding process.

Stage 9 illustrates a state after singulation, where the first substrate 202, the encapsulation layer 208 and the second substrate 26 are diced (e.g., sliced) to remove portions of the first substrate 202, the encapsulation layer 208, the copper balls 810 and the second substrate 206. A mechanical process (e.g., saw) may be used to perform singulation.

Stage 9 may illustrate the package 300 that includes the second substrate 306 that is configured as a heat spreader. As shown at Stage 9, the package 300 is free of the copper balls 810. Moreover, the second substrate 306 is configured to be free of an electrical connection with the integrated device 204. In particular, the plurality of interconnects 362 is configured to be free of an electrical connection with the integrated device 204 and/or the first substrate 202.

The packages (e.g., 200, 300, 400) described in the disclosure may be fabricated one at a time or may be fabricated together as part of one or more wafers and then singulated into individual packages.

Figure 9A:
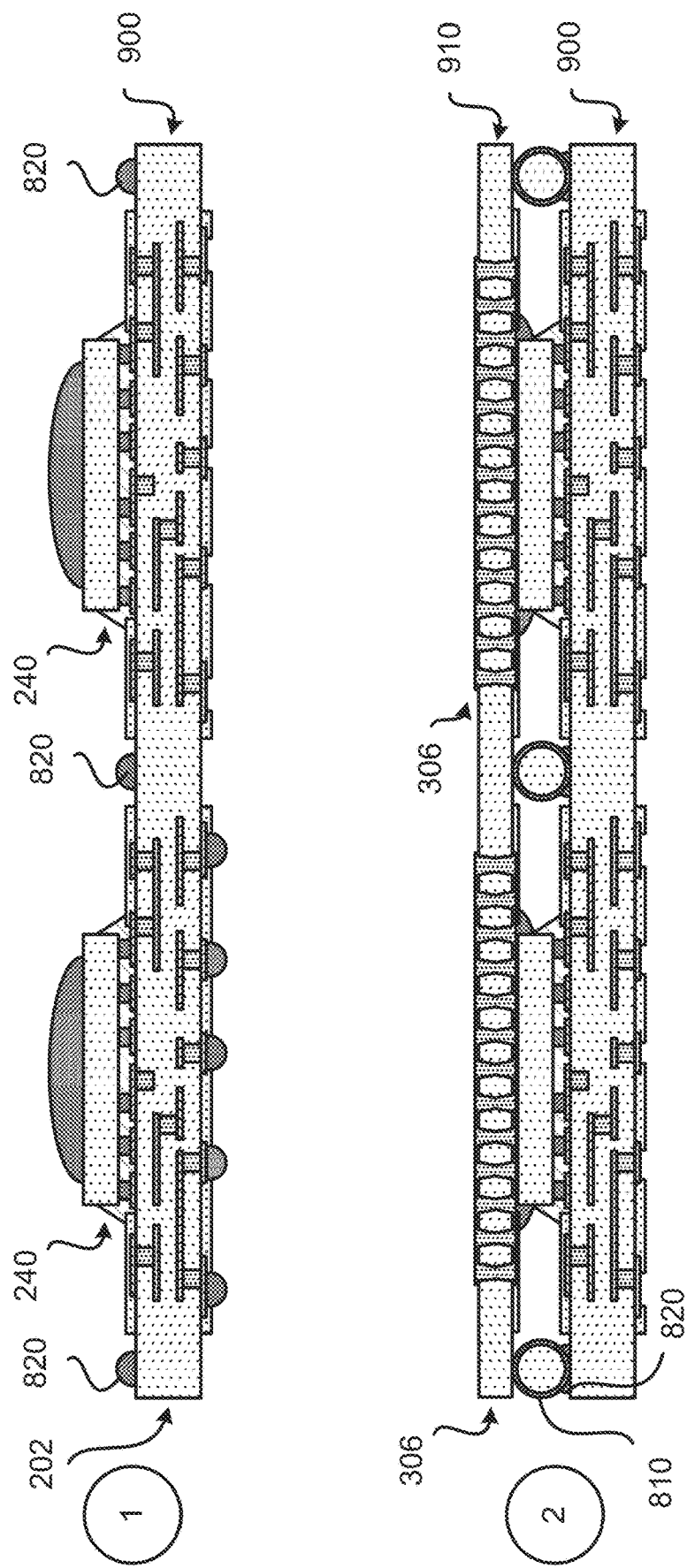
FIG. 9 (comprising FIGS. 9A-9B) illustrates an exemplary sequence for fabricating a package that includes a substrate configured as a heat spreader.
Figure 9B:
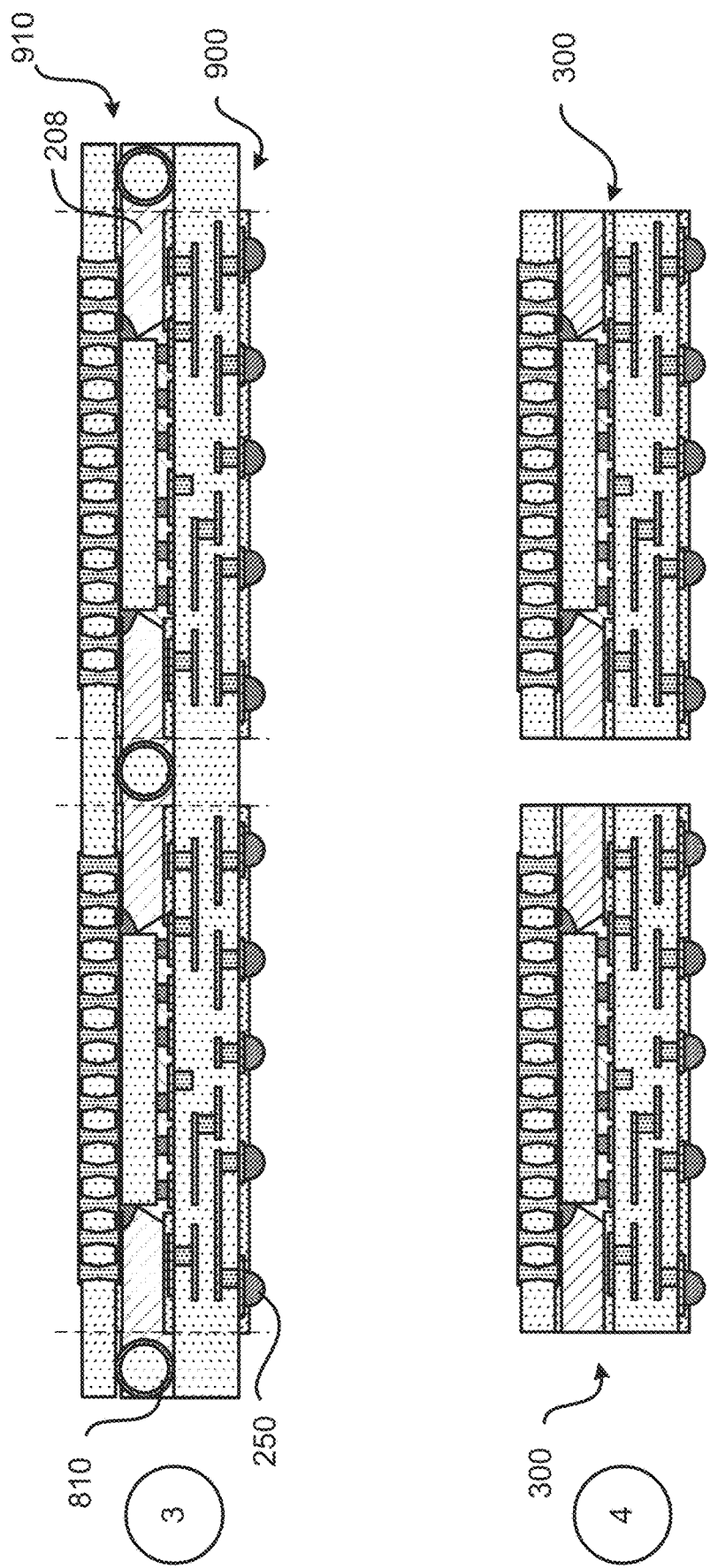

FIG. 9 (which includes FIGS. 9A-9B) illustrates an exemplary sequence for providing or fabricating a package that includes a substrate configured as a heat spreader. In some implementations, the sequence of FIG. 9 may be used to provide or fabricate several packages 300 at a time, where each package includes the second substrate 306 of FIG. 3. The sequence of FIG. 9 may be used to fabricate any of the packages described in the disclosure. FIG. 9 may be used to fabricate a package from one or more wafers that include several packages. The sequence of FIG. 9 may be similar to the sequence of FIGS. 8A-8D, and may incorporate many of the processes described in FIGS. 8A-8D.

It should be noted that the sequence of FIG. 9 may combine one or more stages in order to simplify and/or clarify the sequence for providing or fabricating the package that includes a substrate configured as a heat spreader. In some implementations, the order of the processes may be changed or modified. In some implementations, one or more of processes may be replaced or substituted without departing from the spirit of the disclosure. The sequence of FIG. 9 may be used to fabricate several packages at a time (as part of a wafer), which are then singulated.

Stage 1, as shown in FIG. 9A, illustrates a state that includes a first wafer 900 that includes several first substrates 202 and several integrated devices 204 as described in the disclosure. The first wafer 900 also includes several solder interconnects 820. Stage 1 of FIG. 9 may be similar to Stage 6 of FIG. 8C.

Stage 2 illustrates a state after a second wafer 910 is coupled to the first wafer 900 and the several integrated devices 204. The second wafer 910 includes several second substrates 306, including the dielectric layer 260, the plurality of interconnects 362, and the at least one solder resist layer 264. The copper balls 810 may be coupled to the second wafer 910. The copper balls 810 may be coupled to the first wafer 900 through the solder interconnects 820. Stage 2 of FIG. 9A may be similar to Stage 7 of FIG. 8C.

Stage 3, as shown in FIG. 9B, illustrates a state after the encapsulation layer 208 is provided between the first wafer 900 and the second wafer 910 such that the encapsulation layer 208 is coupled to the first wafer 900 and the second wafer 910. Stage 3 of FIG. 9B may be similar to Stage 8 of FIG. 8D.

Stage 4 illustrates a state after the first wafer 900, the encapsulation layer 208 and the second wafer 910 have been singulated to fabricate several packages 300. Stage 4 of FIG. 9B may be similar to Stage 9 of FIG. 8E.

Figure 10:
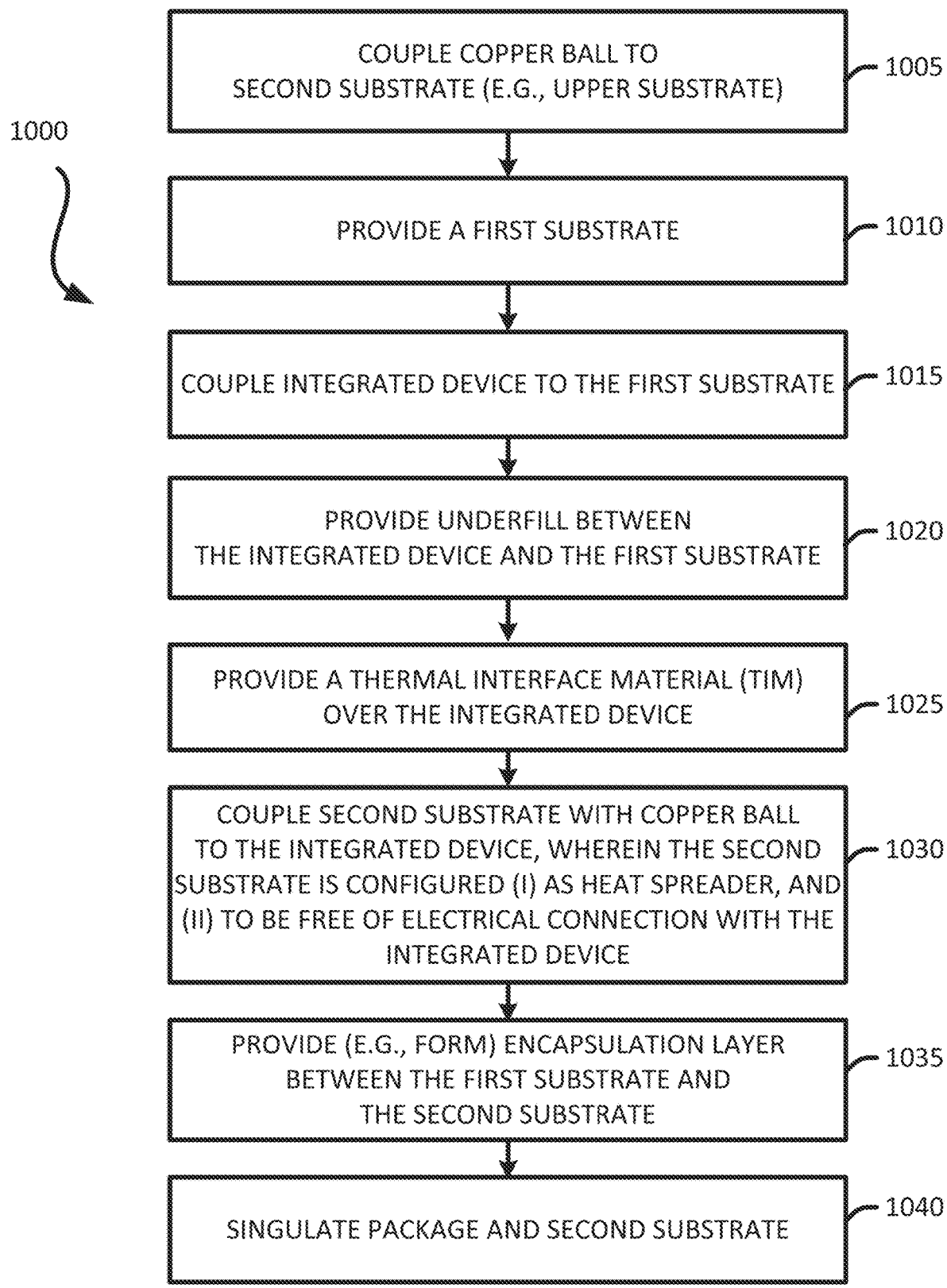
FIG. 10 illustrates an exemplary flow diagram of a method for fabricating a package that includes a substrate configured as a heat spreader.

Exemplary Flow Diagram of a Method for Fabricating a Package that Includes a Substrate Configured as a Heat Spreader In some implementations, fabricating a package that includes a substrate configured as heat spreader includes several processes. FIG. 10 illustrates an exemplary flow diagram of a method 1000 for providing or fabricating a package that includes a substrate configured as heat spreader. In some implementations, the method 1000 of FIG. 10 may be used to provide or fabricate the package 300 of FIG. 3 described in the disclosure. However, the method 1000 may be used to provide or fabricate any of the packages described in the disclosure.

It should be noted that the sequence of FIG. 10 may combine one or more processes in order to simplify and/or clarify the method for providing or fabricating a package that includes a substrate configured as a heat spreader. In some implementations, the order of the processes may be changed or modified.

The method provides (at 1005) couple at least one copper ball (e.g., 810) to a second substrate (e.g., 306). The copper balls 810 may include copper core balls (CCB). The copper balls 810 may include solder. The copper balls 810 may be coupled to a bottom surface of the second substrate 306. The copper balls 810 may be coupled to the at least one solder resist layer 264. The copper balls 810 may be coupled near the edge of the second substrate 306. The second substrate 306 may be configured as a heat spreader. Stage 2 of FIG. 8A illustrates and describes an example of coupling a copper ball to a second substrate.

The method provides (at 1010) a first substrate (e.g., 202). The first substrate 202 may be provided by a supplier or fabricated. A process similar to the process shown in FIGS. 6A-6B may be used to fabricate the first substrate 202. However, different implementations may use different processes to fabricate the first substrate 202. The first substrate 202 includes at least one dielectric layer 220 and a plurality of interconnects 222. Stage 3 of FIG. 8A illustrates and describes an example of providing a first substrate.

The method couples (at 1015) the integrated device (e.g., 204) to the first substrate (e.g., 2020). The integrated device 204 may be coupled to the first substrate 202 through the plurality of interconnects 240. The plurality of interconnects 240 may be coupled to interconnects from the plurality of interconnects 222 of the first substrate 202. The plurality of interconnects 240 may be coupled to interconnects from the plurality of interconnects 222 through solder interconnects. The integrated device 204 may be coupled to the first substrate 202 such that the front side (e.g., active side) of the integrated device 204 is facing the first substrate 202. Stage 4 of FIG. 8B illustrates and describes an example of an integrated device being coupled to a first substrate.

The method provides (at 1020) an underfill (e.g., 280) between the integrated device (e.g., 204) and the first substrate (e.g., 202). The underfill 280 may be formed such that the underfill 280 is coupled to the integrated device 204 and the first substrate 202. Stage 5 of FIG. 8B illustrates and describes an example of an underfill being provided between an integrated device and a first substrate.

The method provides (at 1025) a thermal interface material (TIM) (e.g., 282) over the integrated device (e.g., 204). The TIM 282 may be provided over the integrated device 204 such that the TIM 282 is coupled to the back side of the integrated device 204. Stage 6 of FIG. 8C, illustrates and describes an example of a TIM being provided over an integrated device. The method may also provide a solder interconnect (e.g., 820) over the first substrate 202, as described and illustrated at Stage 6 of FIG. 8C.

The method couples (at 1030) the second substrate (e.g., 306) with the copper balls (e.g., 810) to the first substrate 202 and the integrated device 204. The second substrate 306 is configured as a heat spreader. The second substrate 306 is configured to be free of an electrical connection with the integrated device 204. The second substrate 306 is coupled to the integrated device 204 through the TIM 282. In particular, the second substrate 206 is coupled to the integrated device 204 such that the back side of the integrated device 204 faces the second substrate 306. Stage 7 of FIG. 8C illustrates and describes an example of the second substrate with copper balls being coupled to the first substrate and the integrated device.

The method provides (at 1035) an encapsulation layer (e.g., 208) between the first substrate (e.g., 202) and the second substrate (e.g., 306) such that the encapsulation layer is coupled to the first substrate and the second substrate. The encapsulation layer 208 laterally surrounds the integrated device 204. Stage 8 of FIG. 8D, illustrates and describes an example of an encapsulation layer that is provided between the first substrate and the second substrate.

The method singulates (at 1040) the first substrate (e.g., 202), the encapsulation layer (e.g., 208) and the second substrate (e.g., 206) to remove portions of the first substrate 202, the encapsulation layer 208, the copper balls 810 and the second substrate 206. A mechanical process (e.g., saw) may be used to perform singulation. After singulation, the result may be a package 300 that includes the second substrate 306 that is configured as a heat spreader. After singulation, the package 300 is free of the copper ball 810. Moreover, the second substrate 306 is configured to be free of an electrical connection with the integrated device 204. In particular, the plurality of interconnects 362 is configured to be free of an electrical connection with the integrated device 204 and/or the first substrate 202. Stage 9 of FIG. 8D illustrates and describes an example of singulation.

Exemplary Electronic Devices

Figure 11:
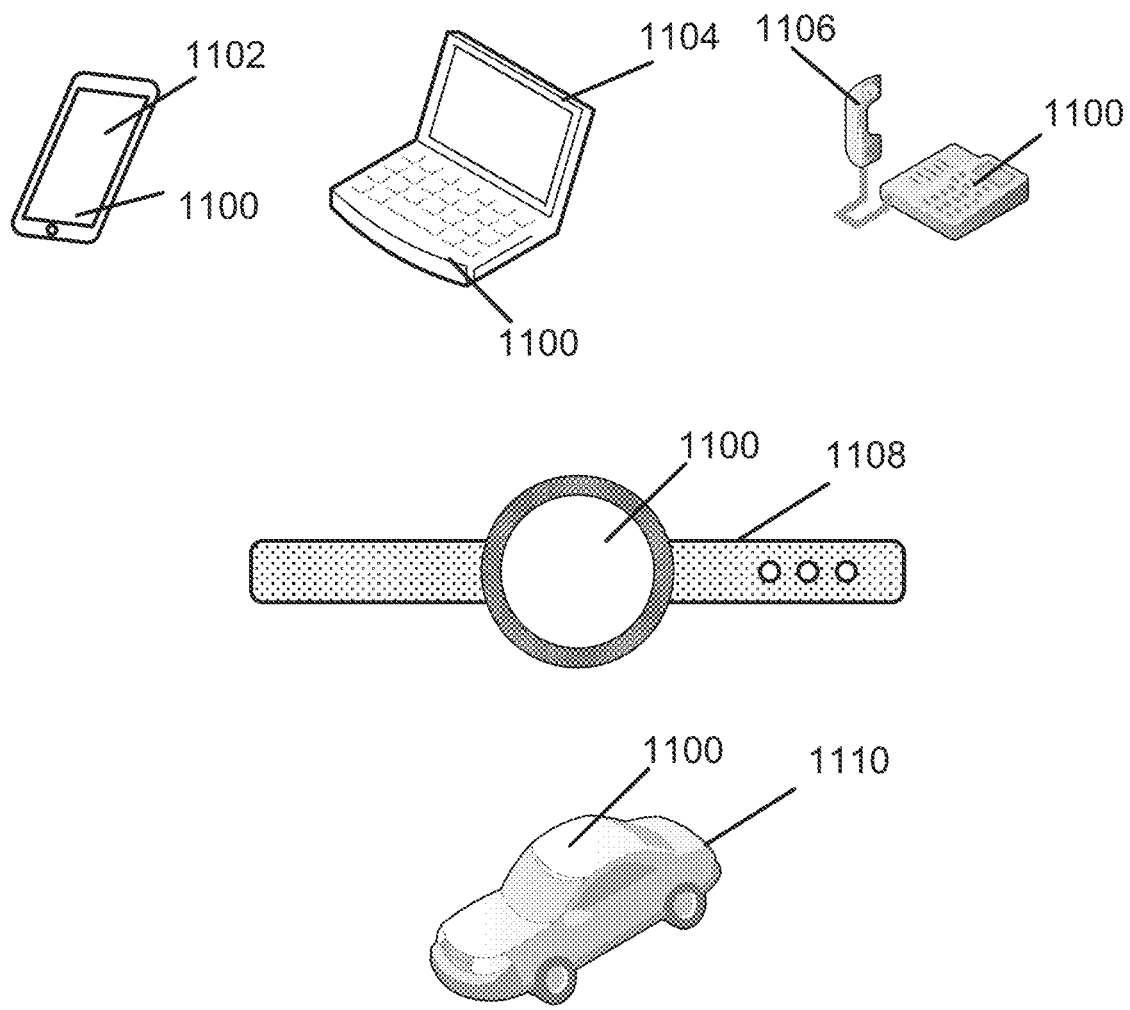
FIG. 11 illustrates various electronic devices that may integrate a die, an integrated device, an integrated passive device (IPD), a passive component, a package, and/or a device package described herein.

FIG. 11 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-5, 6A-6B, 7, 8A-8D, 9A-9B and/or 10-11 may be rearranged and/or combined into a single component, process, feature or function or embodied in several components, processes, or functions. Additional elements, components, processes, and/or functions may also be added without departing from the disclosure. It should also be noted FIGS. 2-5, 6A-6B, 7, 8A-8D, 9A-9B and/or 10-11 and its corresponding description in the present disclosure is not limited to dies and/or ICs. In some implementations, FIGS. 2-5, 6A-6B, 7, 8A-8D, 9A-9B and/or 10-11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel or is capable of traveling between the two objects. The term "electrically coupled" may mean that two objects are capable of an electrical connection. Two objects that are electrically coupled may or may not have an electrical current traveling between the two objects. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect includes an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a first substrate comprising a first coefficient of thermal expansion (CTE) having a value in a range of about 7-15 parts per million per degree Celsius (ppm/C);
an integrated device coupled to the first substrate;
a second substrate coupled to the integrated device,
wherein the second substrate is configured to operate as a heat spreader,
wherein the second substrate comprises a dielectric layer and a plurality of interconnects,
wherein the second substrate is configured to be free of an electrical connection with the integrated device, and
wherein the second substrate comprises a second coefficient of thermal expansion (CTE) having a value in a range of about 7-15 parts per million per degree Celsius (ppm/C); and
an encapsulation layer located between the first substrate and the second substrate.

2. The package of claim 1, further comprising a thermal interface material (TIM) located between the second substrate and the integrated device, wherein the thermal interface material (TIM) is configured to couple the second substrate to the integrated device.

3. The package of claim 1,
wherein the integrated device comprises a front side and a back side,
wherein the front side of the integrated device faces the first substrate, and
wherein the back side of the integrated device faces the second substrate.

4. The package of claim 1, wherein the first substrate comprises a laminated substrate.

5. The package of claim 1, wherein the plurality of interconnects comprises a plurality of vias.

6. A package comprising:
a first substrate;
an integrated device coupled to the first substrate;
a second substrate coupled to the integrated device,
wherein the second substrate is configured to operate as a heat spreader, and
wherein the second substrate comprises a dielectric layer and a plurality of interconnects,
wherein the plurality of interconnects is configured to be free of an electrical connection with the integrated device,
wherein the plurality of interconnects comprises a plurality of vias,
wherein a via from the plurality of vias comprises (i) a first metal layer located on a wall of a cavity of the second substrate, and (ii) a second metal layer located in the cavity of the second substrate, and
an encapsulation layer located between the first substrate and the second substrate.

7. The package of claim 1, wherein the second coefficient of thermal expansion (CTE) that is similar to the first coefficient of thermal expansion (CTE).

8. The package of claim 1, further comprising an underfill located between the integrated device and the first substrate.

9. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

10. An apparatus comprising:
a first substrate comprising a thickness of 400 micrometers or less;
an integrated device coupled to the first substrate;
means for heat spreading coupled to the integrated device,
wherein the means for heat spreading is configured to be free of an electrical connection with the integrated device, and
wherein the means for heat spreading comprises a thickness of 200 micrometers or less; and
an encapsulation layer located between the first substrate and the means for heat spreading, wherein the encapsulation layer comprises a thickness of 200 micrometers or less.

11. The apparatus of claim 10, further comprising a thermal interface material (TIM) located between the means for heat spreading and the integrated device, wherein the thermal interface material (TIM) is configured to couple the means for heat spreading to the integrated device.

12. The apparatus of claim 10,
wherein the integrated device comprises a front side and a back side, wherein the front side of the integrated device faces the first substrate, and wherein the back side of the integrated device faces the means for heat spreading.

13. The apparatus of claim 10, wherein the first substrate comprises a laminated substrate.

14. The apparatus of claim 10, wherein the means for heat spreading comprises a dielectric layer and a plurality of interconnects that is configured to be free of an electrical connection with the integrated device.

15. The apparatus of claim 14, wherein the plurality of interconnects comprises a plurality of vias.

16. The apparatus of claim 15, wherein a via from the plurality of vias comprises (i) a first metal layer located on a wall of a cavity of the means for heat spreading, and (ii) a second metal layer located in the cavity of the means for heat spreading.

17. The apparatus of claim 10,
wherein the first substrate comprises a first coefficient of thermal expansion (CTE), and
wherein the means for heat spreading comprises a second coefficient of thermal expansion (CTE) that is similar to the first coefficient of thermal expansion (CTE).

18. The apparatus of claim 10, further comprising an underfill located between the integrated device and the first substrate.

19. The apparatus of claim 10, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

20. A method for fabricating a package, comprising:
providing a first substrate;
coupling an integrated device to the first substrate;
coupling a second substrate to the integrated device,
wherein the second substrate is configured to operate as a heat spreader,
wherein the second substrate comprises a dielectric layer and a plurality of interconnects,
wherein the dielectric layer of the second substrate includes glass, silicon, quartz, and/or combinations thereof;
wherein the second substrate is configured to be free of an electrical connection with the integrated device; and
forming an encapsulation layer between the first substrate and the second substrate.

21. The method of claim 20, further comprising providing a thermal interface material (TIM) between the second substrate and the integrated device, wherein the thermal interface material (TIM) is configured to couple the second substrate to the integrated device.

22. The method of claim 20,
wherein the integrated device comprises a front side and a back side,
wherein the front side of the integrated device faces the first substrate, and
wherein the back side of the integrated device faces the second substrate.

23. The method of claim 20, wherein the first substrate comprises a laminated substrate.

24. The method of claim 20, wherein the plurality of interconnects comprises a plurality of vias.

25. The method of claim 24, wherein a via from the plurality of vias comprises (i) a first metal layer located on a wall of a cavity of the second substrate, and (ii) a second metal layer located in the cavity of the second substrate.

26. The method of claim 20,
wherein the first substrate comprises a first coefficient of thermal expansion (CTE), and
wherein the second substrate comprises a second coefficient of thermal expansion (CTE) that is similar to the first coefficient of thermal expansion (CTE).

27. The method of claim 20, further comprising an underfill located between the integrated device and the first substrate.

28. The package of claim 1, wherein the dielectric layer of the second substrate includes glass, silicon, quartz, and/or combinations thereof.

29. The package of claim 1,
wherein the package comprises a thickness of about 1000 micrometers or less,
wherein first substrate comprises a thickness of about 400 micrometers of less,
wherein the second substrate comprises a thickness of about 200 micrometers or less, and
wherein the encapsulation layer comprises a thickness of about 200 micrometers or less.

30. The package of claim 1,
wherein the integrated device comprises a coefficient of thermal expansion (CTE) having a value of approximately 7 parts per million per degree Celsius (ppm/C), and
wherein the CTE of the integrated device, the first CTE of the first substrate, and the second CTE of the second substrate are similar.

* * * * *